(12) United States Patent
Miks et al.

(10) Patent No.: US 7,556,986 B1
(45) Date of Patent: Jul. 7, 2009

(54) TAPE SUPPORTED MEMORY CARD LEADFRAME STRUCTURE

(75) Inventors: Jeffrey Alan Miks, Chandler, AZ (US); Curtis Michael Zwenger, Chandler, AZ (US); Brenda Gogue, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 521 days.

(21) Appl. No.: 11/425,502

(22) Filed: Jun. 21, 2006

Related U.S. Application Data

(63) Continuation-in-part of application No. 10/828,616, filed on Apr. 21, 2004, now Pat. No. 7,074,654.

(51) Int. Cl.
*H01L 21/00* (2006.01)

(52) U.S. Cl. .......... 438/118; 438/106; 438/112; 438/123; 438/124; 438/127; 257/666; 257/667; 257/670; 257/787; 257/E23.031; 257/E23.055

(58) Field of Classification Search .......... 438/106, 438/112, 118, 121, 123, 124, 127, FOR. 366, 438/FOR. 369, FOR. 371, FOR. 377, FOR. 380 R; 257/666, 667, 670, 676, 678, 687, 787, E23.031, 257/E23.052, E23.055, E23.034, E23.176
See application file for complete search history.

(56) References Cited

U.S. PATENT DOCUMENTS

| | | | |
|---|---|---|---|
| 3,668,299 A | 6/1972 | McNeal | |
| 4,532,419 A | 7/1985 | Takeda | |
| 4,905,124 A | 2/1990 | Banjo et al. | |
| 4,974,120 A | 11/1990 | Kodai et al. | |
| 5,172,214 A | 12/1992 | Casto | |
| 5,574,309 A | 11/1996 | Papaietro et al. | |
| 5,742,479 A | 4/1998 | Asakura | |
| 5,753,532 A | 5/1998 | Sim | |
| 5,784,259 A | 7/1998 | Asakura | |
| 5,789,280 A | 8/1998 | Yokota et al. | |
| 5,808,359 A | 9/1998 | Muto et al. | |
| 5,822,190 A | 10/1998 | Iwasaki | |
| 5,893,724 A | 4/1999 | Chakravorty et al. | |
| 5,977,613 A | 11/1999 | Takata et al. | |
| 6,040,622 A | 3/2000 | Wallace | |
| 6,143,981 A | 11/2000 | Glenn | |

(Continued)

FOREIGN PATENT DOCUMENTS

JP    3112688    5/1991

(Continued)

*Primary Examiner*—Matthew C Landau
*Assistant Examiner*—Colleen E Rodgers
(74) *Attorney, Agent, or Firm*—Stetina Brunda Garred & Brucker

(57) ABSTRACT

A method of fabricating a memory card. The method comprises the initial step of providing a leadframe which has a dambar and a plurality of contacts, each of the contacts being attached to the dambar by at least one tie bar. A layer of tape is applied to the leadframe such that the tape the bottom contact surfaces of the contacts, at least portions of the bottom dambar surface of the dambar. Thereafter, the tie bars are removed from the leadframe. At least one semiconductor die is electrically connected to the leadframe, with a body thereafter being formed on the leadframe such that the bottom contact surfaces are exposed in an exterior surface thereof.

20 Claims, 13 Drawing Sheets

U.S. PATENT DOCUMENTS

| | | |
|---|---|---|
| D445,096 S | 7/2001 | Wallace |
| D446,525 S | 8/2001 | Okamoto et al. |
| 6,376,283 B1 | 4/2002 | Chen |
| 6,384,472 B1 | 5/2002 | Huang |
| 6,462,273 B1 | 8/2002 | Corisis et al. |
| 6,476,469 B2 | 11/2002 | Hung et al. |
| 6,545,332 B2 | 4/2003 | Huang |
| 6,603,196 B2 | 8/2003 | Lee et al. |
| 6,624,005 B1 | 9/2003 | Di Caprio et al. |
| 7,345,357 B2 * | 3/2008 | Tan et al. .................. 257/670 |
| 2002/0140068 A1 | 10/2002 | Lee |
| 2005/0233500 A1 * | 10/2005 | Kim .......................... 438/123 |
| 2006/0228832 A1 * | 10/2006 | Koh .......................... 438/123 |

FOREIGN PATENT DOCUMENTS

| | | |
|---|---|---|
| JP | 7017175 | 1/1995 |
| JP | 8190615 | 7/1996 |
| JP | 10334205 | 12/1998 |
| KR | 199410938 | 5/1994 |
| KR | 199552621 | 12/1995 |

* cited by examiner

TAPE SUPPORTED MEMORY CARD LEADFRAME STRUCTURE

CROSS-REFERENCE TO RELATED APPLICATIONS

The present application is a continuation-in-part of U.S. application Ser. No. 10/828,616 entitled TAPE SUPPORTED MEMORY CARD LEADFRAME STRUCTURE filed Apr. 21, 2004, now U.S. Pat. No. 7,074,654 the disclosure of which is incorporated herein by reference.

STATEMENT RE: FEDERALLY SPONSORED RESEARCH/DEVELOPMENT

Not Applicable

BACKGROUND OF THE INVENTION

The present invention relates generally to memory cards, and more particularly, to a memory card (e.g., a multi-media card (MMC)) wherein tape or an epoxy is used to support the external signal contacts (ESC's) of the memory card leadframe structure so that the tie bars used to connect the contacts to the outer frame of the leadframe can be removed prior to the molding of the package body of the memory card.

As is well known in the electronics industry, memory cards are being used in increasing numbers to provide memory storage and other electronic functions for devices such as digital cameras, MP3 players, cellular phones, and Personal Digital Assistants. In this regard, memory cards are provided in various formats, including multi-media cards and secure digital cards.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically disposed on the backside of the circuit board substrate, with the electrical connection to the dies being provided by vias which extend through the circuit board substrate.

In an effort to simplify the process steps needed to fabricate the memory card, there has been developed by Applicant a memory card wherein a leadframe assembly is used as an alternative to the circuit board substrate, as described in Applicant's co-pending U.S. application Ser. No. 09/956,190 entitled LEAD-FRAME METHOD AND ASSEMBLY FOR INTERCONNECTING CIRCUITS WITHIN A CIRCUIT MODULE filed Sep. 19, 2001, the disclosure of which is incorporated herein by reference. As is described in Ser. No. 09/956,190, the leadframe and semiconductor die of the memory card are covered with an encapsulant which hardens into a cover or body of the memory card. The body is sized and configured to meet or achieve a "form factor" for the memory card. In the completed memory card, the contacts of the leadframe are exposed within a common surface of the body, with the die pad of the leadframe and the semiconductor die mounted thereto being disposed within or covered by the body.

Memory cards, such as multi-media cards, are used by advancing the same into a host socket which includes a plurality of connector pins. Many host sockets include nine connector pins to accommodate the seven contacts included in many memory card formats such as multi-media cards, and the nine contacts included in the secure digital card memory card format. Applicant has previously determined that one of the drawbacks associated with leadframe based memory cards is that portions of the tie bars which are used to connect the contacts to the outer frame of the leadframe are typically exposed in the leading edge of the memory card which is initially advanced into the host socket. More particularly, exposed within this leading edge are the severed ends of the tie bars created as a result of the cutting or singulation process typically used to separate the outer frame of the leadframe from the remainder thereof subsequent to the formation of the body of the memory card. These exposed portions of the tie bars give rise to a potential to short against the metal features of the host socket, and are thus highly undesirable.

The present invention addresses and overcomes the above-described deficiencies of currently known leadframe based memory cards by providing a memory card wherein tape or an epoxy is used to support the contacts of the memory card leadframe structure so that the tie bars used to secure the contacts to the outer frame can be removed prior to the molding of the body of the memory card. More particularly, the tape or epoxy is applied to the leadframe, with the tie bars thereafter being punched out or otherwise removed, thus leaving the tape or epoxy to hold the contacts of the leadframe structure in place during the remaining steps of the assembly process. These and other attributes of the present invention will be described in more detail below.

BRIEF SUMMARY OF THE INVENTION

In accordance with the present invention, there is provided a method for manufacturing a memory card such as a multi-media card wherein one or more layers of tape is applied to a leadframe for purposes of supporting the contacts of the leadframe in a manner allowing for the removal of the tie bars of the leadframe used to support the contacts within the dambar thereof. More particularly, tape is used to support the ESC pads or contacts of the leadframe structure so that the contact supporting tie bars can be removed prior to the molding of the body of the memory card. More particularly, tape is applied to the top and/or bottom surfaces of the leadframe, with the tie bars thereafter being punched out or otherwise removed from the leadframe, thus leaving the tape to hold the contacts of the leadframe structure in place during further assembly processing steps.

As a result of the complete removal of the tie bars attaching the contacts of the leadframe to the dambar thereof, the completely formed memory card does not include any tie bar ends exposed in the leading edge thereof. In this regard, the absence of the exposed ends of the tie bars in the leading edge of the memory card eliminates the potential for the tie bars shorting against the metal features of the host socket into which the memory card is to be inserted.

In accordance with alternative embodiments of the present invention, there is also provided a manufacturing method for a memory card wherein the leadframe is not provided with contact supporting tie bars at all, the contacts being supported within the interior of the dambar of the leadframe via a layer of tape. In this embodiment, a two-step molding operation is completed to form the body of the memory card, such body including radiused edges or corners which extend around the entire perimeter of the memory card, and also being devoid of any exposed tie bars. In yet another alternative embodiment of the present invention, the leading edge or side of the memory card is subjected to a milling or etching process which effectively contours the same such that the exposed ends of the contact supporting tie bars will not engage any metal features of the host socket.

In still yet another alternative embodiment of the present invention, a semiconductor die is placed directly upon the tape applied to the leadframe, with a second semiconductor die being positioned upon a die pad of the leadframe which is also secured to and suspended within the dambar thereof by tic bars. The tie bars supporting the contacts and the die pad within the dambar are punched or otherwise removed from the leadframe, with one surface of that semiconductor die originally secured to the tape being exposed in the fully formed body of the memory card subsequent to the removal of the tape therefrom. In still yet another alternative embodiment of the present invention, a semiconductor die is placed directly upon the tape applied to the leadframe, with one or more additional semiconductor dies being positioned directly upon the contacts of the leadframe which are secured to and suspended within the dambar thereof by tie bars. The tie bars supporting the contacts within the dambar are punched or otherwise removed from the leadframe, with one surface of that semiconductor die originally secured to the tape being exposed in the fully formed body of the memory card subsequent to the removal of the tape therefrom.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
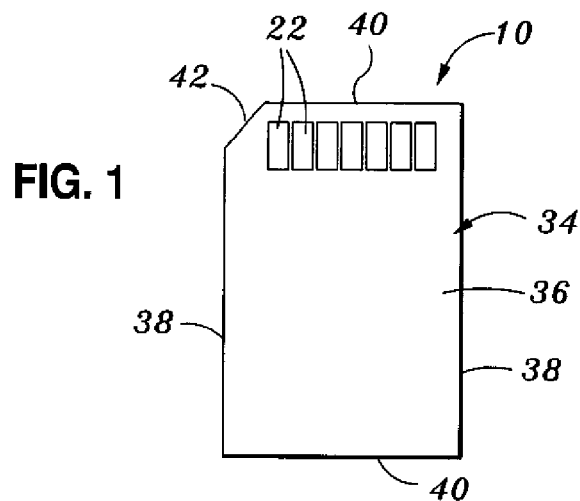
FIG. 1 is a bottom plan view of a memory card fabricated through the use of a tape supported leadframe in accordance with the present invention.
Figure 2:
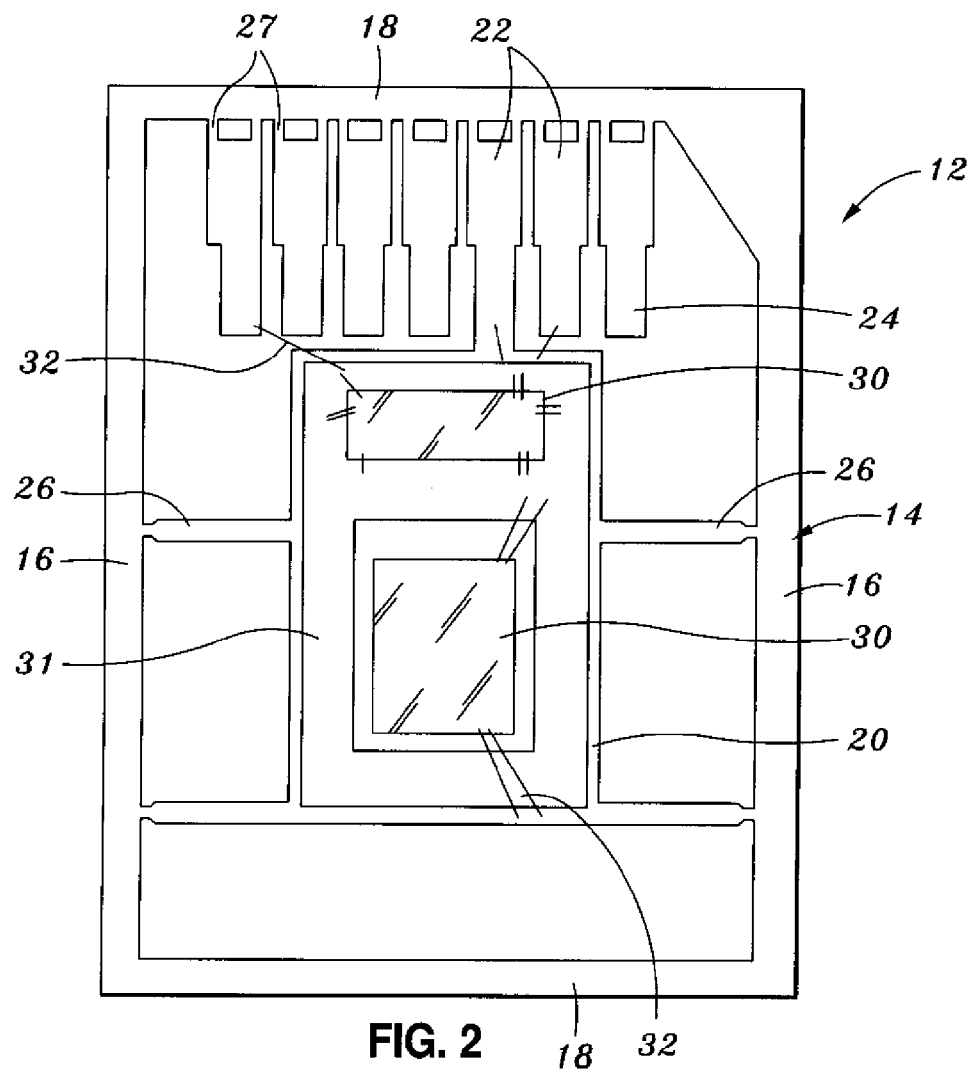
FIG. 2 is a top plan view of the leadframe of the memory card shown in FIG. 1 prior to the application of the tape thereto.

Referring now to the drawings wherein the showings are for purposes of illustrating preferred embodiments of the present invention only, and not for purposes of limiting the same, FIG. 1 depicts a memory card 10 which includes a leadframe 12 best shown in FIG. 2. As shown in FIG. 1, the memory card 10 has a form factor particularly suited for use in a multi-media card memory application. However, those of ordinary skill in the art will recognize that the memory card 10 may have alternative memory card formats, including those of secure digital cards (SDC), compact flash (CF), smart media, memory stick, and other small form factor memory cards.

The leadframe 12 of the memory card 10 comprises an outer frame or dambar 14 which is eventually removed from the leadframe 12 as described below, and thus does not constitute part of the completed memory card 10. Dambar 14 has a generally rectangular configuration defining an opposed pair of longitudinal sides or segments 16 and an opposed pair of lateral sides or segments 18. In addition to the dambar 14, the leadframe 12 includes a die attach area or die pad 20 which is disposed within the interior of the dambar 14. Die pad 20 defines opposed, generally planar top and bottom surfaces. Integrally connected to and extending from one lateral side 18 of the dambar 14 is a plurality of contacts 22 of the leadframe 12. Each of the contacts 22 also defines opposed, generally planar top and bottom surfaces. Integrally connected to and extending from each of the contacts 22 is a conductive trace 24. The traces 24 terminate in close proximity to the die pad 20. Tie bars 26 are used to integrally connect the die pad 20 to the longitudinal sides 16 of the dambar 14. Similarly, one or more tie bars 27 are used to integrally connect the contacts 22 to one lateral side 18 of the dambar 14. In particular, as is seen in FIG. 2, two tie bars 27 are integrally connected to and extend between each contact 22 and the corresponding lateral side 18, though one or more than two tie bars 27 may be used to facilitate such connection.

In the memory card 10, attached to the top surface of the die pad 20 are multiple semiconductor dies 30. In FIG. 2, a pair of semiconductor dies 30 is shown as being attached and electrically connected to a common interposer or laminate substrate 31, which is in turn attached to the top surface of the die pad 20. The semiconductor dies 30 and/or the substrate 31 are electrically connected to the leadframe 12, and more particularly to one or more traces 24, the die pad 20, and/or each other through the use of conductive wires 32. In this regard, the conductive wires 32 effectively place the semiconductor dies 30 into electrical communication with the leadframe 12 and, more particularly, to one or more of the contacts 22 thereof.

The leadframe 12 is preferably fabricated from a conductive metal material (e.g., copper) through either a chemical etching or mechanical stamping process. Those of ordinary skill in the art will recognize that the leadframe 12 may be formed to include any number of contacts 22 depending on the desired application for the memory card 10. As shown in FIG. 1, the memory card 10 includes seven contacts 22 which is the typical number included for a multi-media card application. The leadframe 12 may further be alternatively configured to define more than one die pad, with the die pad(s) accommodating one or more semiconductor dies alone or in combination with other devices such as passive devices. Additionally, the two semiconductor dies 30 shown in FIG. 2 may be attached directly to the die pad 20 as opposed to the intervening substrate 31. Further, the two semiconductor dies 30 shown in FIG. 2 may be substituted with one or more than two semiconductor dies alone or in combination with one or more other devices. Still further, one or more than two semiconductor dies and/or one or more other devices can be attached to a single die pad, or to respective ones of multiple dies pads, such semiconductor die(s) and/or other device(s) being attached either directly to the die pad(s) or to one or more intervening substrates. The pattern of conductive traces 24 may also be varied depending upon the number and arrangement of die pads and the number of semiconductor dies and/or other passive devices included in the memory card 10. Thus, the configuration of the leadframe 12 of the memory card 10 is variable, in that the number and arrangement of die pads, contacts, and conductive traces may be varied as needed to satisfy the requirements of a particular application. Along these lines, the number and arrangement of the semiconductor dies 30 shown in FIG. 2 is also exemplary only in that such number and arrangement may also be varied based on specific application requirements.

Figure 3A:
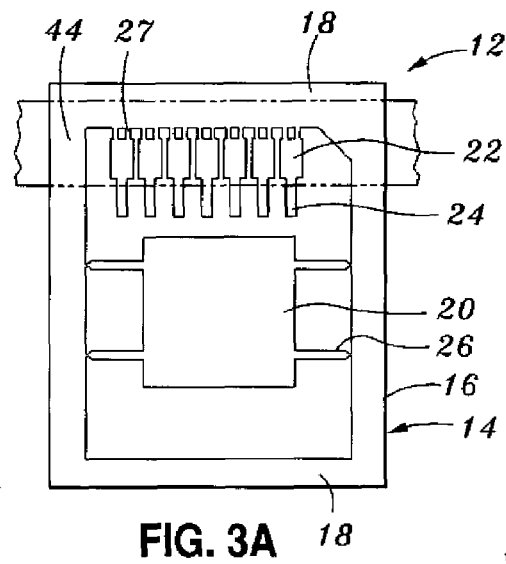
FIGS. 3A and 3B are top plan views of the leadframe of the memory card illustrating an exemplary sequence of steps which may be used to facilitate the application of tape thereto and the singulation of the tie bars thereof in accordance with a first embodiment of the present invention.
Figure 3B:
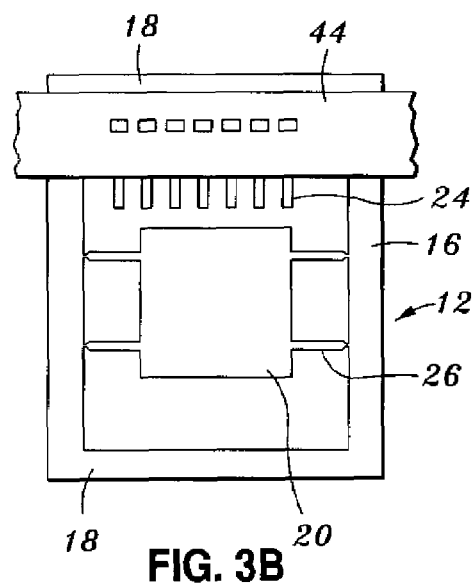
Figure 4:
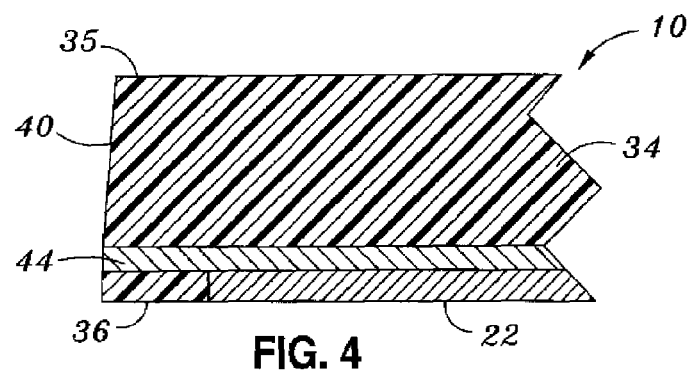
FIG. 4 is a partial cross-sectional view of a memory card formed through the implementation of the fabrication steps shown in FIGS. 3A and 3B.

Referring now to FIGS. 3A, 3B and 4, in accordance with a first embodiment of the present invention, the memory card 10 is fabricated by initially forming the leadframe 12 to have the above-described structural attributes. Thereafter, an elongate strip or layer of tape 44 is applied to the top surface of the leadframe 12. More particularly, as shown in FIG. 3A, the tape 44 is applied to the top surface of the leadframe 12 such that the top surfaces of the contacts 22 and the top surfaces of the tie bars 27 are completely covered by the tape 44, with portions of the top surfaces of the traces 24 and a portion of the top surface of the lateral side 18 to which the tie bars 27 are connected being partially covered by the tape 44. As further seen in FIG. 3A, the tape 44 also extends to and covers portions of the top surfaces of the longitudinal sides 16 of the dambar 14.

Subsequent to the application of the tape 44 to the leadframe 12 in the manner shown in FIG. 3A, a singulation (e.g., a punching) operation is completed which effectively facilitates the removal of the tie bars 27 from the leadframe 12. More particularly, the tie bars 27 are punched-out through the tape 44, thus effectively separating the contacts 22 from the dambar 14, and electrically isolating the contacts 22 from each other. Subsequent to the completion of the punching operation, the semiconductor die(s) 30 and/or other devices are secured to the top surface of the die pad 20 and electrically connected thereto and/or to the traces 24 through the use of the conductive wires 32. Those of ordinary skill in the art will recognize that the application of the tape 44 to the leadframe 12 and removal of the tie bars 27 could occur subsequent to the attachment and electrical connection of the semiconductor die(s) 30 and/or other devices to the leadframe 12.

After the semiconductor die(s) 30 and/or other devices have been attached and electrically connected to the leadframe 12, and the tie bars 27 have been removed in the above-described manner, an encapsulant material is applied to the leadframe 12, the semiconductor die(s) 30, and conductive wires 32. The encapsulant is further applied to the portion of the tape 44 remaining subsequent to the removal of the tie bars 27 by the punching operation. The encapsulant material is preferably a plastic (e.g., thermoset, thermoplastic) which, upon hardening, forms a body 34 of the memory card 10. The body 34 is formed to provide a prescribed form factor for the memory card 10. The body 34 defines a generally planar top surface 35, and an opposed, generally planar bottom surface 36. In addition, the body 34 defines an opposed pair of longitudinal sides 38, an opposed pair of lateral sides 40, and a fifth sloped side 42 which extends angularly between one of the lateral sides 40 and one of the longitudinal sides 38. In the completed body 34, the bottom surfaces of the contacts 22 of the leadframe 12 are exposed in and generally flush with the bottom surface 36 of the body 34. Additionally, the tape 44 is embedded within the body 34 in the manner best shown in FIG. 4. In the fully formed memory card 10, one edge of the tape 44 extends to and is thus exposed in the leading edge or side 40 of the body 34, i.e., the side 40 adjacent to and extending along the contacts 22. It is contemplated that, as an alternative to the tape 44, a layer of epoxy may be applied to the leadframe 12 in a manner covering those portions thereof described above as being covered by the tape 44. The hardening of the epoxy creates a layer which provides the same functional attributes as the tape 44.

The fabrication of the memory card 10 through the application of the tape 44 or epoxy layer to the leadframe 12 provides significant advantages over currently known fabrication techniques. In accordance with such techniques, the body 34 would be formed on the leadframe 12 such that the dambar 14 and portions of the tie bars 26, 27 remain exposed (i.e., are not covered by the body 34). The exposure of the dambar 14 and portions of the tie bars 26, 27 allows for the removal of the same from the completely formed body 34. In this regard, subsequent to the formation of the body 34, the leadframe 12 would be cut or singulated in a manner facilitating the removal of the dambar 14 as is needed to electrically isolate the traces 24 and hence the contacts 22 from each other. However, as indicated above, the severing of the tie bars 27 result in the severed distal ends thereof still being exposed in the leading edge of the body 34. Such exposure gives rise to potential occurrences of shorting against the metal features of the host socket.

Figure 5A:
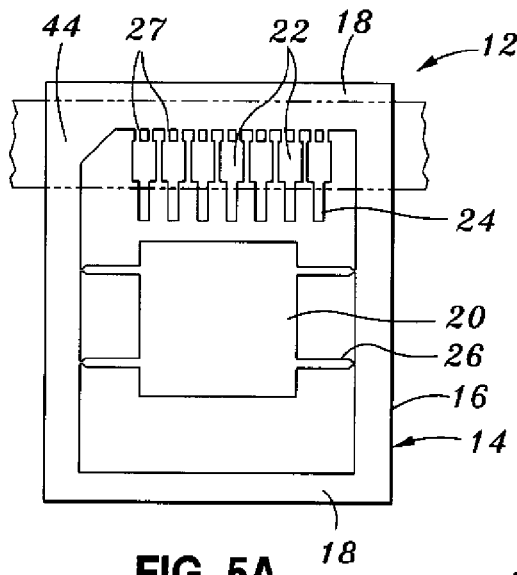
FIGS. 5A and 5B are bottom plan views of the leadframe of the memory card illustrating an exemplary sequence of steps which may be used to facilitate the application of the tape thereto and the singulation of the tie bars thereof in accordance with a second embodiment of the present invention.
Figure 5B:
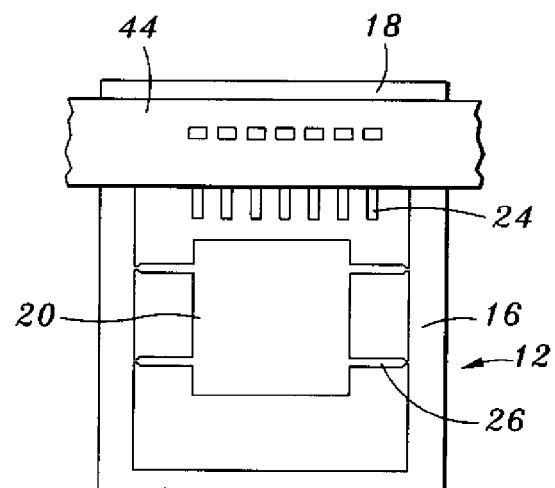
Figure 6:
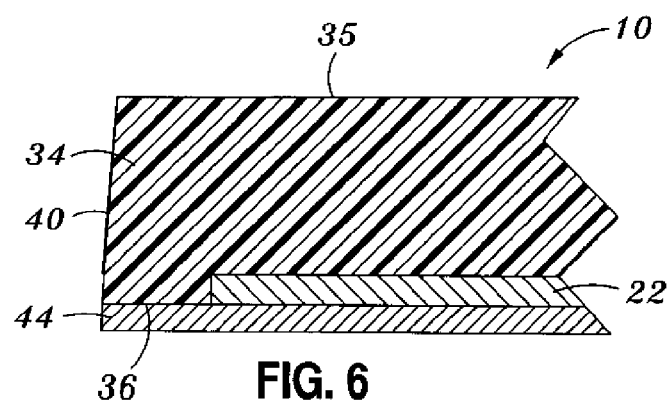
FIG. 6 is a partial cross-sectional view of a memory card formed through the implementation of the fabrication steps shown in FIGS. 5A and 5B.

Referring now to FIGS. 5A, 5B and 6, in accordance with a second embodiment of the present invention, the memory card 10 is fabricated by essentially the same process described above in relation to FIGS. 3A, 3B and 4, except that the tape 44 is applied to the bottom surface of the leadframe 12, rather than to the top surface thereof as described in relation to the first embodiment. More particularly, as shown in FIG. 5A, the tape 44 is applied to the bottom surface of the leadframe 12 such that the bottom surfaces of the contacts 22 and the bottom surfaces of the tie bars 27 are completely covered by the tape 44, with portions of the bottom surfaces of the traces 24 and a portion of the bottom surface of the lateral side 18 to which the tie bars 27 are connected being partially covered by the tape 44. The tape 44 also extends to and covers portions of the bottom surfaces of the longitudinal sides 16 of the dambar 14. In the event the traces 24 of the leadframe 12 are optionally "upset" (i.e., perpendicularly recessed or offset relative to the bottom surfaces of the contacts 22), the tape 44 will not cover the bottom surfaces of the traces 24, but rather will be spaced therefrom.

Figure 11:
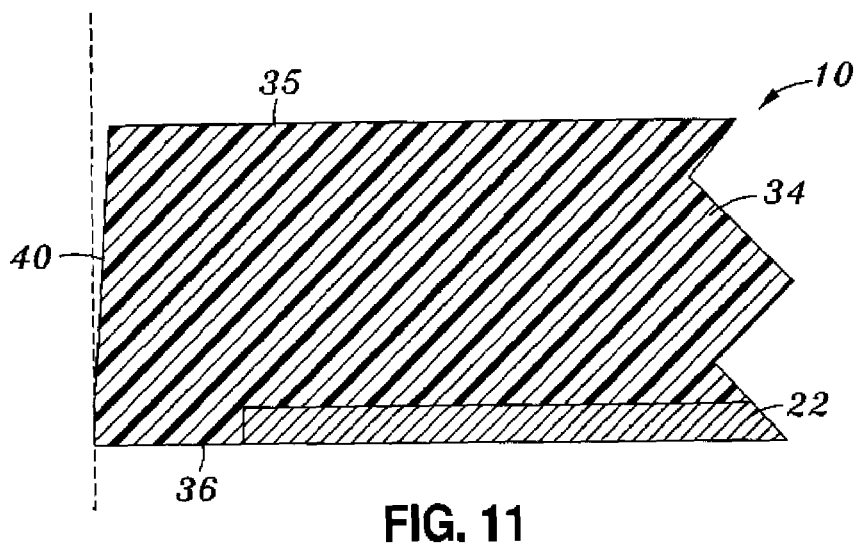
FIG. 11 is a partial cross-sectional view of the memory cards shown in FIGS. 6, and 10 subsequent to the removal of the tape from the ESC pads thereof.

Subsequent to the application of the tape 44 to the leadframe 12 in the manner shown in FIG. 5A, the above-described punching operation is completed to effectively facilitate the removal of the tie bars 27 from the leadframe 12 in the manner shown in FIG. 5B. After the semiconductor die(s) 30 and/or other devices have been attached and electrically connected to the leadframe 12, and the tie bars 27 have been removed therefrom, the body 34 of the memory card 10 is formed in the above-described manner. As seen in FIG. 6, due to the application of the tape 44 to the bottom surface of the leadframe 12, in the fully formed memory card 10, the tape 44 is not embedded within the body 34, but rather simply extends over the bottom surfaces of the contacts 22 and a portion of the bottom surface 36 of the body 34. Thus, subsequent to the formation of the body 34, the tape 44 may be completely removed, thus causing the memory card 10 to have the cross-sectional configuration shown in FIG. 11, the tape 44 not constituting part of the complete memory card 10.

Figure 7A:
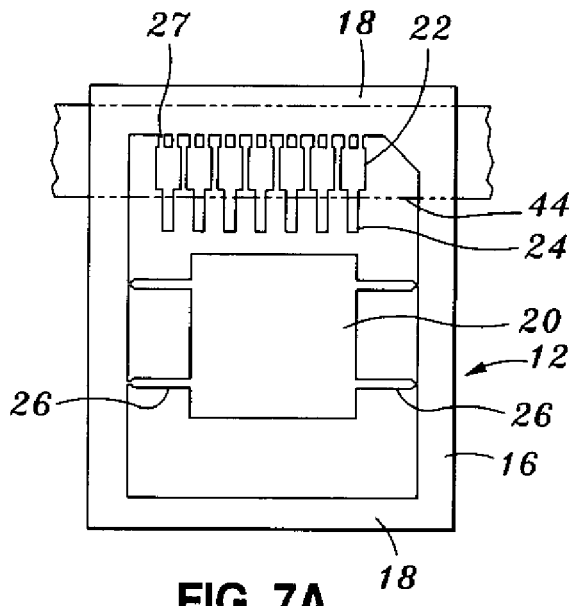
FIGS. 7A and 7B are top plan views of the leadframe of the memory card illustrating an exemplary sequence of steps which may be used to facilitate the application of tape thereto and the singulation of the tie bars thereof in accordance with a third embodiment of the present invention.
Figure 7B:
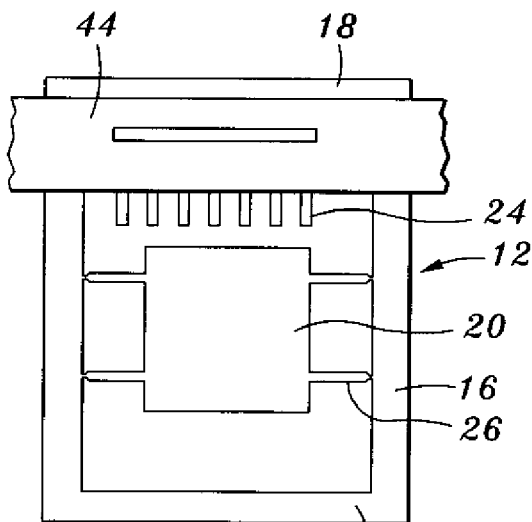
Figure 8:
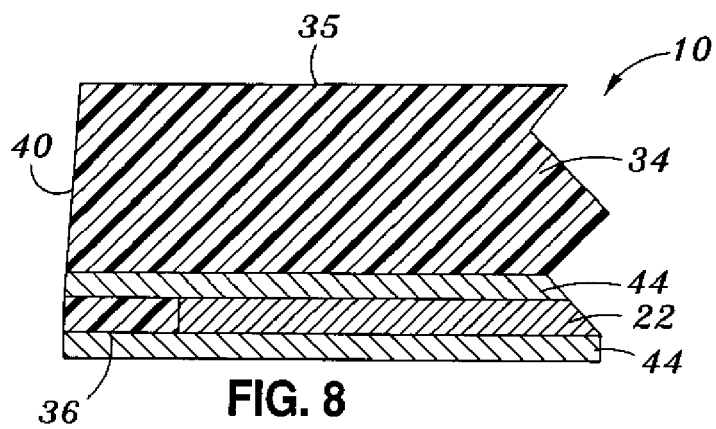
FIG. 8 is a partial cross-sectional view of a memory card formed through the implementation of the fabrication steps shown in FIGS. 7A and 7B.

Referring now to FIGS. 7A, 7B and 8, in accordance with the third embodiment of the present invention, the memory card 10 is fabricated by essentially the same process described above in relation to FIGS. 3A, 3B and 4, except that the tape 44 is applied to both the top and bottom surfaces of the leadframe 12, rather than only to the top surface thereof as described in relation to the first embodiment, or only to the bottom surface thereof as described in relation to the second embodiment. More particularly, as shown in FIG. 7A, the tape 44 is applied to both the top and bottom surfaces of the leadframe 12 such that the top and bottom surfaces of the contacts 22 and the top and bottom surfaces of the tie bars 27 are completely covered by respective layers of the tape 44. Portions of the top and bottom surfaces of the traces 24 and portions of the top and bottom surfaces of the lateral side 18 to which the tie bars 27 are connected are partially covered by respective layers of the tape 44. The layers of tape 44 also extend to and cover portions of the top and bottom surfaces of the longitudinal sides 16 of the dambar 14.

Subsequent to the application of the layers of tape 44 to respective top and bottom surfaces of the leadframe 12 in the manner shown in FIG. 5A, the above-described punching operation is completed to effectively facilitate the removal of the tie bars 27 from the leadframe 12 in the manner shown in FIG. 7B. When the layers of tape 44 are applied to both the top and bottom surfaces of the leadframe 12, the punching operation is completed in a manner wherein a single, elongate slot is formed through the layers of tape 44 as is shown in FIG. 7B. This is in contrast to the type of punching operation which occurs in relation to the first and second embodiments wherein the completion of the punching operation facilitates the formation of a series of small, linearly aligned openings in either the top layer of tape 44 (in the case of the first embodiment as shown in FIG. 3B) or in the bottom layer of tape 44 (in the case of the second embodiment as shown in FIG. 5B).

After the semiconductor die(s) 30 and/or other devices have been attached and electrically connected to the leadframe 12, and the tie bars 27 have been removed therefrom, the body 34 of the memory card 10 in the third embodiment is formed in the same manner described above in relation to the first and second embodiments. As seen in FIG. 8, due to the application of the layers of tape 44 to the top and bottom surfaces of the leadframe 12, in the fully formed memory card 10, the layer of tape 44 applied to the top surface of the leadframe 12 is embedded within the body 34, with one edge thereof extending to and thus being exposed in the leading edge or side 40 of the body 34. The layer of tape 44 attached to the bottom surface of the leadframe 12 is not embedded within the body 34 of the fully formed memory card 10, but rather simply extends over the bottom surfaces of the contacts 22 and a portion of the bottom surface 36 of the body 34. Thus, subsequent to the formation of the body 34, this bottom layer of tape 44 may be completely removed, thus causing the memory card 10 to have the cross-sectional configuration shown in FIG. 4.

Figure 9A:
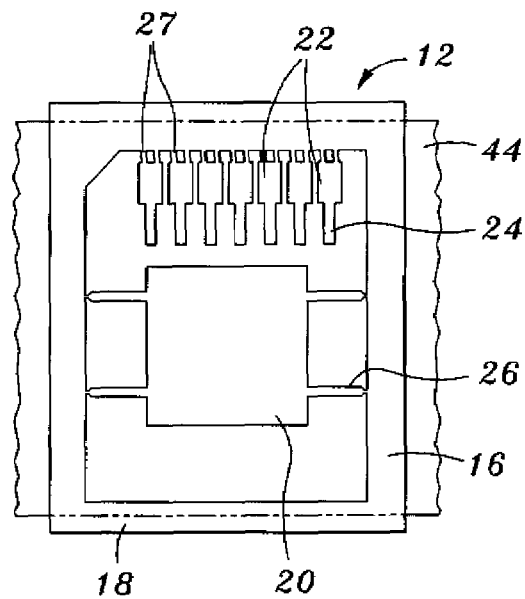
FIGS. 9A and 9B are top plan views of the leadframe of the memory card illustrating an exemplary sequence of steps which may be used to facilitate the application of tape thereto and the singulation of the tie bars thereof in accordance with a fourth embodiment of the present invention.
Figure 9B:
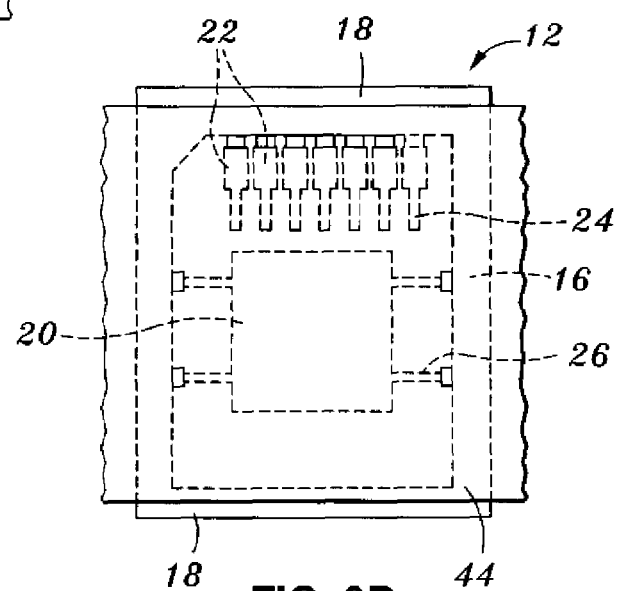
Figure 10:
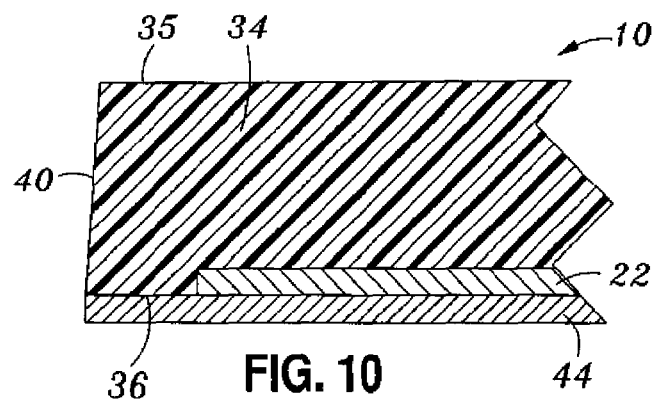
FIG. 10 is a partial cross-sectional view of a memory card formed through the implementation of the fabrication steps shown in FIGS. 9A and 9B.

Referring now to FIGS. 9A, 9B and 10, in accordance with a fourth embodiment of the present invention, the memory card 10 is fabricated by essentially the same process described above in relation to FIGS. 5A, 5B and 6, except that the width of the layer of tape 44 applied to the bottom surface of the leadframe 12 in the fourth embodiment substantially exceeds that of the tape 44 applied to the bottom surface of the leadframe 12 in the second embodiment. More particularly, as shown in FIG. 9A, the tape 44 is applied to the bottom surface of the leadframe 12 such that the bottom surfaces of the contacts 22, the bottom surfaces of the traces 24, the bottom surfaces of the tie bars 26, 27, and the bottom surface of the die pad 20 are completely covered by the tape 44. The tape 44 also extends to and covers at least portions of the bottom surfaces of the longitudinal and lateral sides 16, 18 of the dambar 14. However, the tape 44 may be spaced from the bottom surfaces of the traces 24 and the tie bars 26, 27 in the event the leadframe 12 is optionally subjected to a half-etching process wherein the bottom surfaces of the traces 24 and tie bars 26, 27 are perpendicularly recessed relative to the bottom surfaces of the die pad 20 and contacts 22.

Subsequent to the application of the tape 44 to the leadframe 12 in the manner shown in FIG. 9A, the above-described punching operation is completed to effectively facilitate the removal of the tie bars 27 from the leadframe 12 in the manner shown in FIG. 9B. The punching operation also effectively separates the tie bars 26 from the longitudinal sides 16 of the dambar 14 in the manner shown in FIG. 9B. After the semiconductor die(s) 30 and/or other devices have been attached and electrically connected to the leadframe 12, and the tie bars 27 have been removed therefrom, the body 34 of the memory card 10 is formed in the above-described manner. As seen in FIG. 10, due to the application of the tape 44 to the bottom surface of the leadframe 12, in the fully formed memory card 10, the tape 44 is not embedded in the body 34, but rather simply extends over the entire bottom surface 36 of the body 34, including the bottom surfaces of the contacts 22. Thus, subsequent to the formation of the body 34, the tape 44 may be completely removed, thus causing the memory card 10 to have the cross-sectional configuration shown in FIG. 11 wherein the tape 44 does not constitute part of the complete memory card 10.

Those of ordinary skill in the art will recognize that in each of the above-described embodiments of the present invention, the layer(s) of tape 44 may be substituted with epoxy in the manner described in relation to the first embodiment. Additionally, in any embodiment of the present invention, the punching operation may be completed so as to facilitate the formation of the series of openings as shown in FIGS. 3B, 5B, and 9B, or the single elongate slot as shown in FIG. 7B. As will be recognized, the openings or slot created as a result of the punching operation must be sized and configured as necessary to ensure the complete removal of all of the tie bars 27 extending between the contacts 22 and the dambar 14. Additionally, though a punching operation is the preferred method to facilitate the removal of the tie bars 27 from the leadframe 12, those of ordinary skill in the art will recognize that removal methods other for a punching operation are contemplated to be within the spirit and scope of the present invention. In each embodiment of the present invention, the complete removal of the tie bars 27 made possible by the inclusion of the layer(s) of tape 44 applied to the leadframe 12 provides the advantages specifically discussed in relation to the first embodiment.

Figure 12:
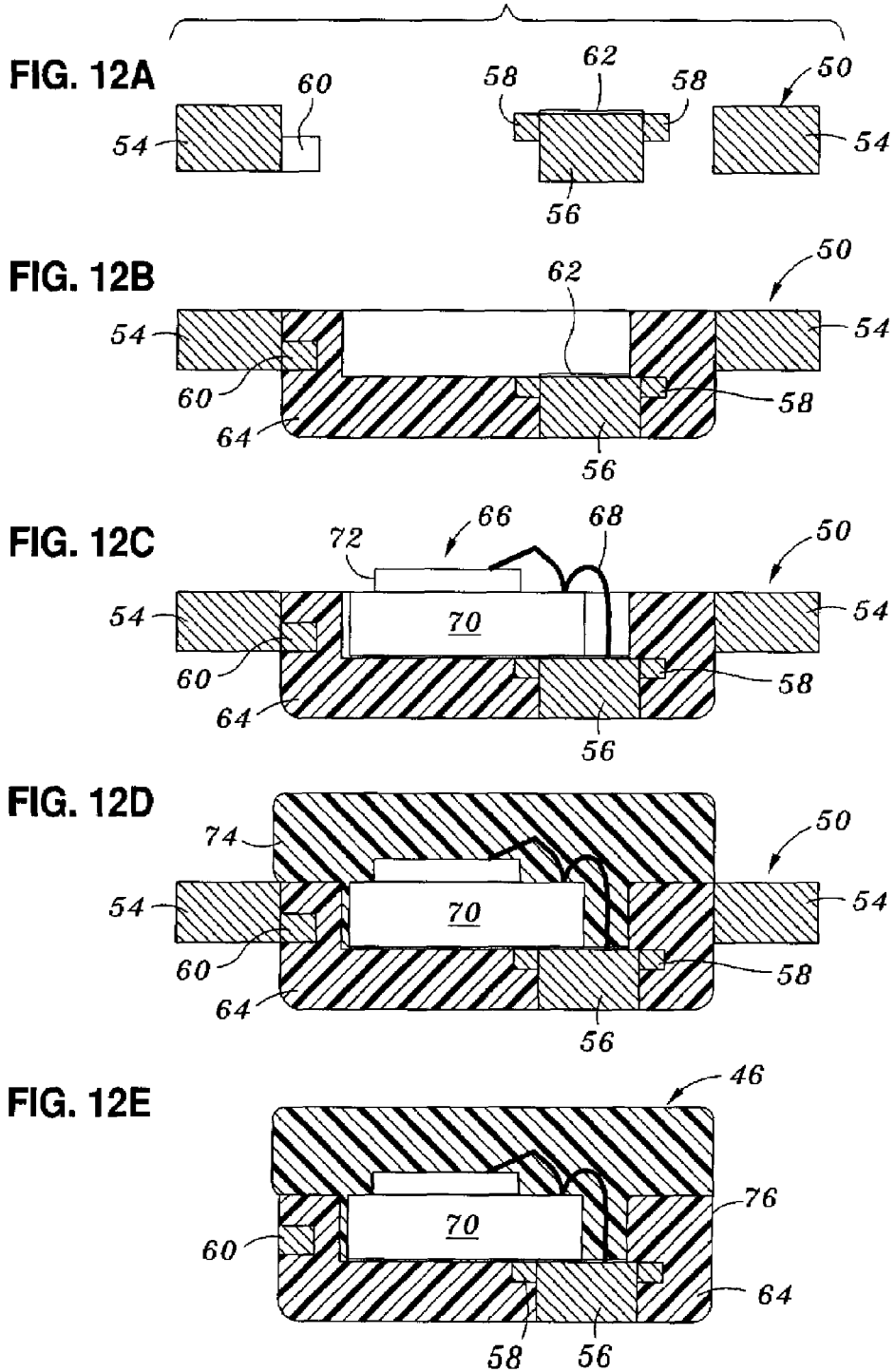
FIGS. 12A-12E illustrate an exemplary sequence of steps which may be used to facilitate fabrication of a memory card in accordance with a fifth embodiment of the present invention.
Figure 13:
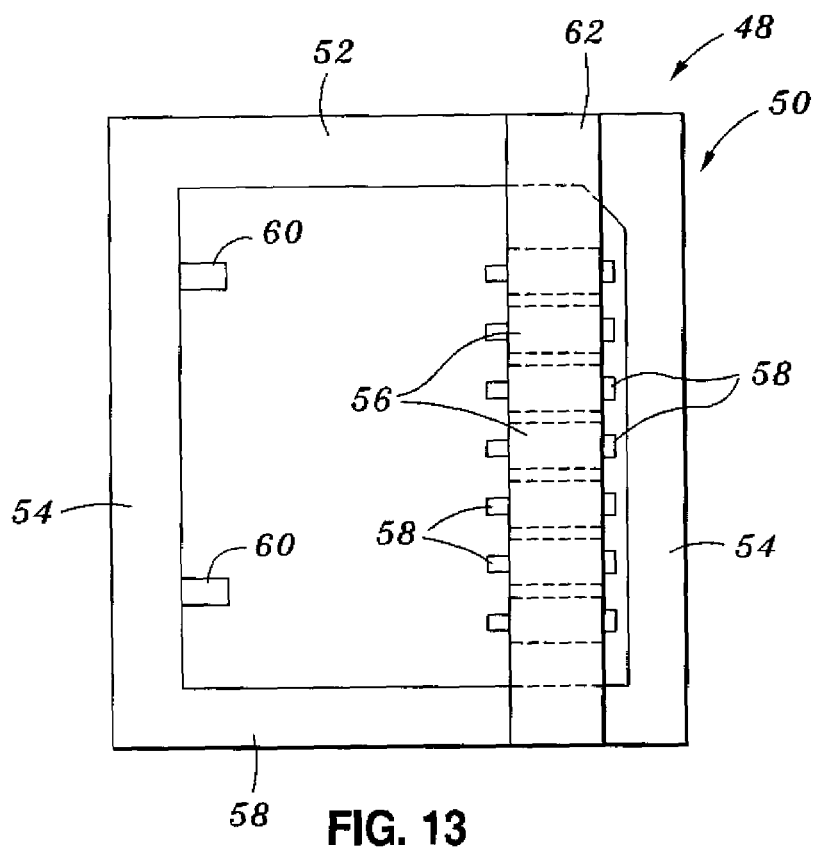
FIG. 13 is a top plan view of the leadframe of the memory card having tape applied thereto in accordance with the fifth embodiment, the side elevational view of which is shown in FIG. 12A.

Referring now to FIGS. 12A-12E and 13, there is depicted an exemplary sequence of steps which may be used to facilitate the fabrication of a memory card 46 (shown in FIG. 12E) in accordance with a fifth embodiment of the present invention. As seen in FIG. 13, the memory card 46 comprises a leadframe 48 having an outer frame or dambar 50. Dambar 50 has a generally quadrangular configuration defining an opposed pair of longitudinal sides or segments 52 and an opposed pair of lateral sides or segments 54. Disposed within the interior of the dambar 50 is a plurality of contacts 56 of the leadframe 48. The contacts 56 are linearly aligned and extend in spaced, generally parallel relation to one of the lateral sides 54 of the dambar 50. Protruding from each of the opposed lateral ends of each contact 56 is a locking tab 58. As such, each contact 56 includes a pair of locking tabs 58 extending from respective ones of the opposed ends thereof. As seen in FIG. 12A, the thickness of each contact 56 substantially exceeds the thickness of each of the locking tabs 58 of the pair protruding therefrom. Additionally, formed on and extending inwardly from the lateral side 54 of the dambar 50 opposite that along which the contacts 56 extend is a pair of locking tabs 60. Like the locking tabs 58, the locking tabs 60 are formed such that the thicknesses thereof are substantially less than that of the dambar 50, as is also seen in FIG. 12A. The use of the locking tabs 58, 60 will be described in more detail below.

In contrast to the above-described leadframe 12, the leadframe 48 used to fabricate the memory card 46 does not include a die pad. Nor are tie bars used to connect the contacts 56 of the leadframe 48 to the adjacent lateral side 54 of the dambar 50. Rather, to facilitate the fabrication of the memory card 46, the contacts 56 are maintained in prescribed orientations relative to each other and to the dambar 50 via an elongate layer or strip of tape 62. In this regard, as seen in FIGS. 12A and 13, in the initial step of fabricating the memory card 46, the tape 62 is applied to the top surface of the leadframe 48 such that the top surfaces of the contacts 56 and portions of the longitudinal sides 52 of the dambar 50 are covered by the tape 62.

Subsequent to the application of the tape 62 to the leadframe 48 in the above-described manner, a first molding process is completed to facilitate the fabrication of a lower body section 64 of the memory card 46 (FIG. 12B). During this initial molding process, downward pressure is applied to the tape 62 and hence to the contacts 56 in a manner which causes the contacts 56 to be vertically downset or recessed relative to the dambar 50 in the manner shown in FIG. 12B. Importantly, the tape 62 has sufficient pliability so as to allow for such downsetting of the contacts 56, despite the opposed ends portions of the tape 62 being maintained in engagement to the longitudinal sides 52 of the dambar 50. The formation of the lower body section 64 occurs subsequent to such downsetting of the contacts 56. As further seen in FIG. 12B, the contacts 56 are effectively mechanically interlocked to the lower body section 64 as a result of the flow of the encapsulant material which ultimately hardens into the lower body section 64 about the locking tabs 58 of each contact 56. Similarly, the encapsulant material which ultimately hardens into the lower body section 64 also flows about the locking tabs 60 protruding inwardly from one lateral side 54 of the dambar 50. Importantly, the lower body section 64 is formed to have a radiused edge which extends around the entire perimeter of the generally planar bottom surface thereof. The generally planar bottom surfaces of the contacts 56 are also exposed in and substantially flush with the bottom surface of the lower body section 64.

Subsequent to the formation of the lower body section 64, an electronic component 66 is mounted within a cavity defined by the lower body section 64, and electrically connected to the top surface of at least one of the contacts 56 by a conductive wire 68 (FIG. 12C). As seen in FIG. 12C, the electronic component comprises a laminate substrate 70 having a semiconductor die 72 which is mounted to the top surface thereof and electrically connected thereto, the substrate 70 in turn being electrically connected to one or more of the contacts 56 by one or more wires 68. Since it is contemplated that the tape 62 will not be removed from the top surfaces of the contacts 56, it will be recognized that portions of the tape will need to be removed as necessary to allow for the advancement of the wire(s) 68 to the top surface(s) of the contact(s) 56. However, it is further contemplated that the tape 62 may be completely removed from the top surfaces of the contacts 56 subsequent to the formation of the lower body section 64. Those of ordinary skill in the art will further appreciate that the electronic component 66 shown and described in relation to FIG. 12C is exemplary only, in that one or more semiconductor dies and/or one or more other devices, mounted or not mounted to a laminate substrate, may be placed into the cavity of the lower body section 64 and electrically connected to the contact(s) 56 with or without the use of the conductive wire(s) 68.

Subsequent to the mounting of the electronic component 66 to the lower body section 64 and electrical connection of the electronic component 66 to the contact(s) 56, a second molding operation is completed to facilitate the formation of an upper body section 74 upon the lower body section 64 (FIG. 12D). The lower body section 74 fills the open areas of the cavity defined by the lower body section 64, and completely covers or encapsulates the electronic component 66 and the wire(s) 68 (if any) used to electrically connect the electronic component 66 to the contacts 56. Like the lower body section 64, the upper body section 74 is preferably molded such that a radiused edge extends about the entire perimeter of the generally planar top surface of the upper body section 74. Subsequent to the formation of the upper body section 74, a singulation process is completed to facilitate the removal of the dambar 50 from the remainder of the leadframe 48 (FIG. 12E). The removal of the dambar 50 effectively completes the fabrication of the memory card 46. The fully formed memory card 46 has a body which is collectively defined by the lower and upper body sections 64, 74 described above. Due to the complete absence of any tie bars in the leadframe 48, the leading edge or side 76 of the body of the memory card 46 does not have any tie bar ends exposed therein.

Figure 14:
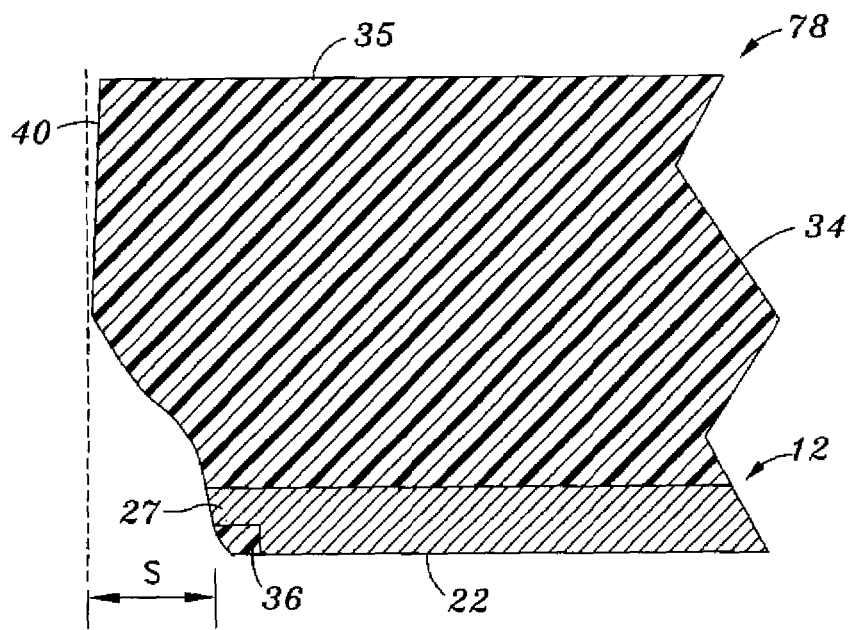
FIG. 14 is a partial cross-sectional view of a memory card formed in accordance with a sixth embodiment of the present invention.

Referring now to FIG. 14, there is shown a partial cross-section of a memory card 78 formed in accordance with a sixth embodiment of the present invention. The memory card 78 includes the above-described leadframe 12. However, in the process of fabricating the memory card 78, no layer of tape is applied to either the top or bottom surfaces of the leadframe 12. Rather, after the semiconductor die(s) 30 and/or other devices have been attached and electrically connected to the leadframe 12, the body 34 is formed on the leadframe 12 in the above-described manner. Since, in the initial steps of the fabrication process for the memory card 78, the tie bars 27 are not punched or otherwise removed from the leadframe 12, upon the formation of the body 34 and singulation of the dambar 14 from the remainder of the leadframe 12, the severed distal ends of the tie bars 27 will be exposed in the leading edge or side 40 of the body 34, i.e., the side 40 adjacent to and extending along the contacts 22.

In accordance with the sixth embodiment of the present invention, a milling or etching process is conducted upon the lower peripheral edge or corner of the leading side 40 of the body 34, this milling or etching procedure imparting a contoured profile to a portion of such leading side 40 in the manner shown in FIG. 14. Due to such contoured profile, the distal ends of the tie bars 27 are exposed only in the contoured portion of the leading side 40, and thus are recessed relative that portion of the side 40 which is unaffected by the milling or etching procedure. Thus, the contoured portion of the leading side 40 of the body 34 creates a safety margin S as shown in FIG. 14 wherein the exposed ends of the tie bars 27 are substantially prevented from making contact with the metal features of the host socket.

Figure 15:
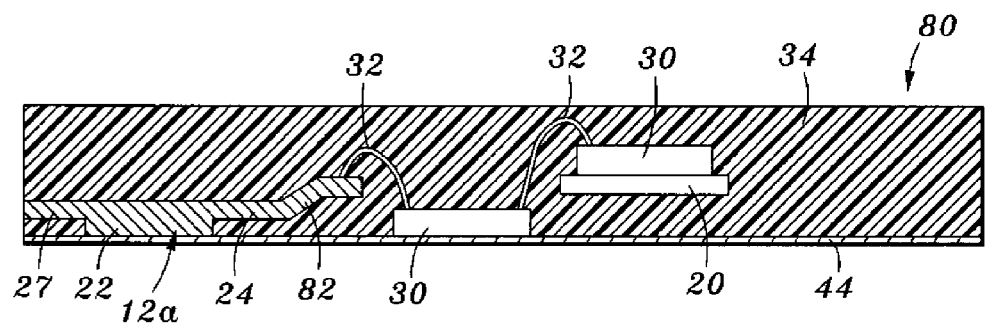
FIG. 15 is a cross-sectional view of a memory card formed in accordance with a seventh embodiment of the present invention.
Figure 16:
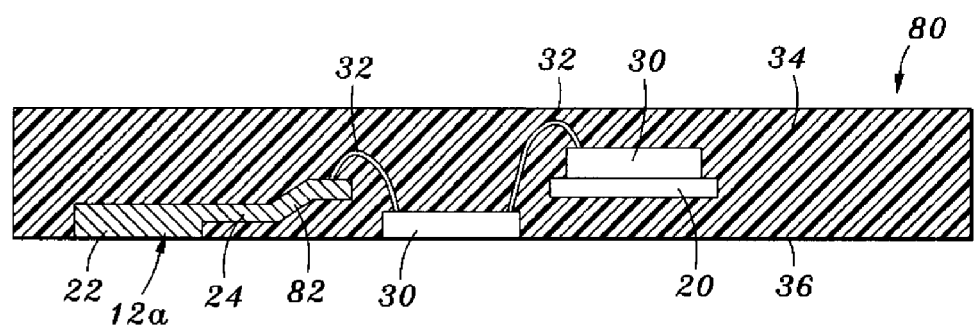
FIG. 16 is a cross-sectional view of the memory card shown in FIG. 15 subsequent to the removal of the tape from the ESC pads thereof.

Referring now to FIGS. 15 and 16, there is shown a memory card 80 constructed in accordance with an eighth embodiment of the present invention. The memory card 80 includes a leadframe 12a, the structural attributes of which bear close similarity to the above-described leadframe 12. In this regard, the distinction between the leadframes 12, 12a, lies in each of the traces 24 in the leadframe 12a being formed to include a downset 82 which causes the contacts 22 and the die pad 20 of the leadframe 12a to extend along respective ones of a spaced, generally parallel pair of planes. The tie bars 26 used to facilitate the attachment of the die pad 20 to the dambar 14 of the leadframe 12a will similarly be formed to include downsets similar to the downsets 82 to facilitate the elevation of the die pad 20 relative to the contacts 22. In this regard, as seen in FIGS. 15 and 16, the die pad 20 extends along a first plane which is elevated relative to a second plane upon which each of the contacts 22 resides.

The method of fabricating the memory card 80 bears substantial similarity to the process described above in relation to FIGS. 9a, 9b and 10. In this regard, the leadframe 12a is initially formed to have the above-described structural attributes, with the layer of tape 44 thereafter being applied to the bottom surface of the leadframe 12a. More particularly, the tape 44 is applied to the bottom surface of the leadframe 12a such that the bottom surfaces of the contacts 22 and at least portions of the bottom surfaces of the longitudinal and lateral sides 16, 18 of the dambar 14 of the leadframe 12a are completely covered thereby. As seen in FIGS. 15 and 16, the tape 44 is spaced from the bottom surfaces of the traces 24 and the tie bars 27 (as well as the tie bars 26) due to the leadframe 12a being subjected to a half-etching process wherein the bottom surfaces of the traces 24 and tie bars 26, 27 are perpendicularly recessed relative to the bottom surfaces of the contacts 22. Further, due to the inclusion of the downsets 82 in the traces 24 and the downsets within the tie bars 27, the tape 44 is also spaced from the bottom surface of the die pad 20. Subsequent to the application of the tape 44 to the bottom surface of the leadframe 12a, a first electronic device 30 (e.g., a semiconductor die) is attached to the top surface of the die pad 20, with a second electronic device 30 (e.g., an LED, finger print sensor, mechanical switch, etc.) being attached to a portion of the top surface of the tape 44 which resides between the inner, distal ends of the traces 24 and the die pad 20, in the manner shown in FIGS. 15 and 16. Thereafter, the conductive wires 32 are used to electrically connect the electronic devices 30 to each other and to those portions of the traces 24 which are disposed between the downsets 82 and electronic devices 30, and thus extend in generally co-planar relation to the die pad 20.

Subsequent to the application of the tape 44 to the leadframe 12a and the attachment of the electronic devices 30 to the die pad 20 and tape 44 in the above-described manner, a punching operation is completed to effectively facilitate the removal of the tie bars 27 from the leadframe 12a. The punching operation also effectively facilitates the separation or severing of the tie bars 26 from the dambar 14 in a manner similar to that shown in FIG. 9B. After the electronic devices 30 have been electrically connected to the leadframe 12a in the above-described manner and the tic bars 26, 27 have been severed or otherwise removed therefrom, an encapsulant material is applied to the leadframe 12a, the electronic devices 30, and conductive wires 32. The encapsulant is further applied to the portion of the tape 44 remaining subsequent to the removal of the tie bars 27 and partial removal of the tie bars 26 by the punching operation. As described above in relation to prior embodiments of the present invention, the encapsulant material, upon hardening, forms the body 34 of the memory card 80. The body 34 is formed to provide a prescribed form factor for the memory card 80. In the completed body 34, the bottom surfaces of the contacts 22 of the leadframe 12a are exposed in and generally flush with the bottom surface 36 of the body 34. Also exposed in and generally flush with the bottom surface 36 of the body 34 is the bottom surface of that electronic device 30 attached to the tape 44. As will be recognized, the bottom surface 36 of the body 34, and hence the bottom surfaces of the contacts 22 and one of the electronic devices 30 are exposed as a result of the removal of the tape 44 from the completed memory card 80 subsequent to the formation of the body 34, as shown in FIG. 16. As will be recognized, the removal of the tie bars 27 and severing of the tie bars 26 allows for the complete separation of the dambar 14 from the remainder of the leadframe 12a either prior or subsequent to the formation of the body 34. As a result, the body 34 may be formed such that no metal features are exposed in the front lateral side or leading edge thereof, or in either of the opposed longitudinal sides thereof since those portions of the tie bars 26 remaining subsequent to the completion of the punching operation are completely covered or encapsulated by the body 34. Also completely encapsulated by the body 34 is the die pad 20 and that electronic device 30 mounted thereto.

Figure 17A:
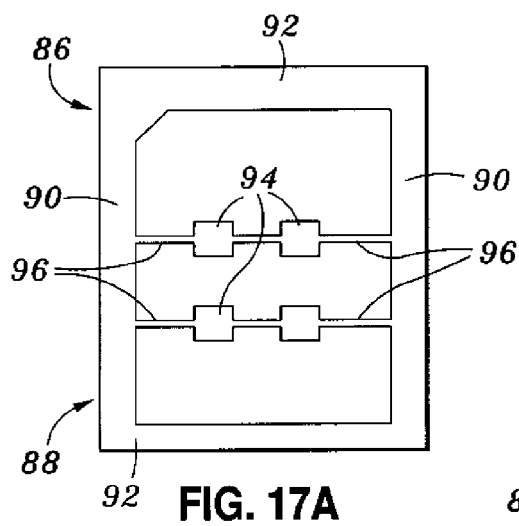
FIGS. 17A-17C are top plan views illustrating an exemplary sequence of steps which may be used to facilitate the application of tape to a leadframe and the singulation of the tie bars thereof to facilitate the fabrication of a memory card in accordance with an eighth embodiment of the present invention.
Figure 17B:
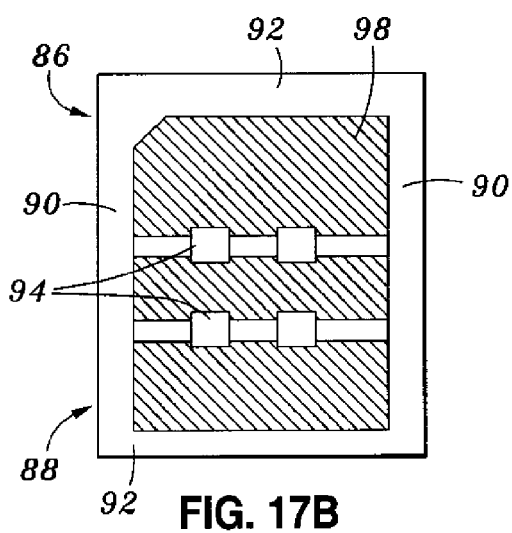
Figure 17C:
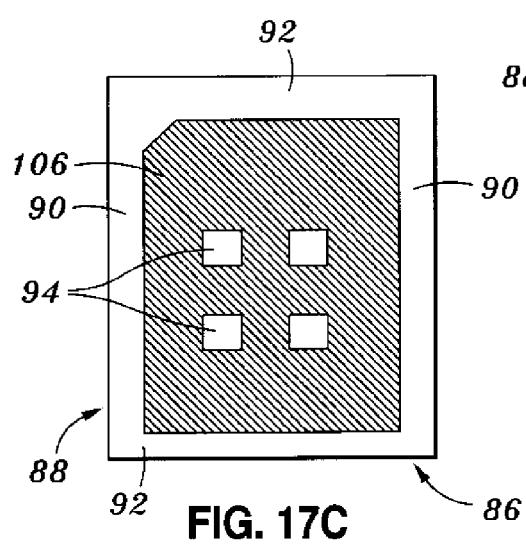

Referring now to FIGS. 17A-17C, there is shown an exemplary sequence of steps which may be used to facilitate the fabrication of a memory card 84 (shown in FIGS. 18 and 19) constructed in accordance with an eighth embodiment of the present invention. The memory card 84 includes a leadframe 86 comprising an outer frame or dambar 88 which is eventually removed from the leadframe 86 as described below, and thus does not constitute part of the completed memory card 84. The dambar 88 has a generally rectangular configuration defining an opposed pair of longitudinal sides or segments 90 and an opposed pair of lateral sides or segments 92. Disposed within the interior of the dambar 88 is a plurality of ESC pads or contacts 94, each of which defines opposed generally planar top and bottom surfaces. The contacts 94 are integrally connected to each other and to each of the longitudinal sides 90 of the dambar 88 by a series of tie bars 96. The leadframe 86 is preferably fabricated from a conductive metal material such as copper through either a chemical etching or a mechanical stamping process. Though the leadframe 86 shown in FIGS. 17A-17C is formed to include four contacts 94, those of ordinary skill in the art will recognize that the leadframe 86 may be formed to include any number of contacts 94 attached to the dambar 88 in any one of a multiplicity of different arrangements through the use of the tie bars 96. In fabricating the memory card 84, subsequent to the formation of the leadframe 86 to have the above-described structural attributes (FIG. 17A), a layer of tape 98 is applied to the bottom surface of the leadframe 86 (FIG. 17B). More particularly, the tape 98 is applied to the bottom surface of the leadframe 86 such that the bottom surfaces of the contacts 94 are completely covered by the tape 98, as are at least portions of the bottom surfaces of the longitudinal and lateral sides 90, 92 of the dambar 88. Subsequent to the application of the tape 98 to the leadframe 86, a singulation (e.g., a punching) operation is completed which effectively facilitates the removal of the tie bars 96 from the leadframe 86 in the manner also shown in FIG. 17B. In this regard, the tie bars 96 are punched-out through the tape 98, thus effectively separating and electrically isolating the contacts 94 from each other and from the dambar 88.

Figure 18:
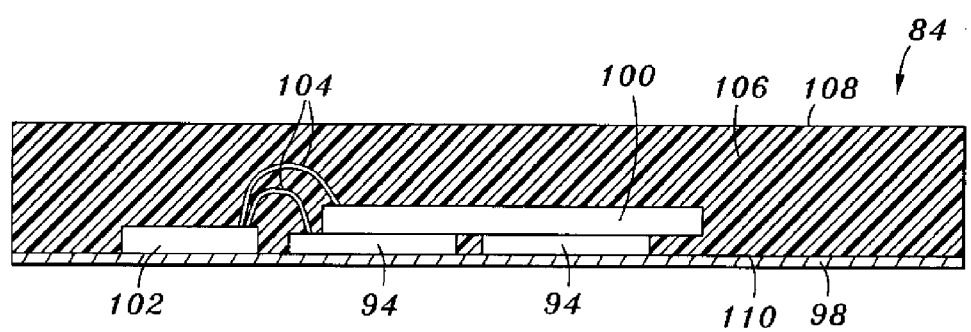
FIG. 18 is a cross-sectional view of the memory card of the eighth embodiment formed through the implementation of the fabrication steps shown in FIGS. 17A-17C.
Figure 19:
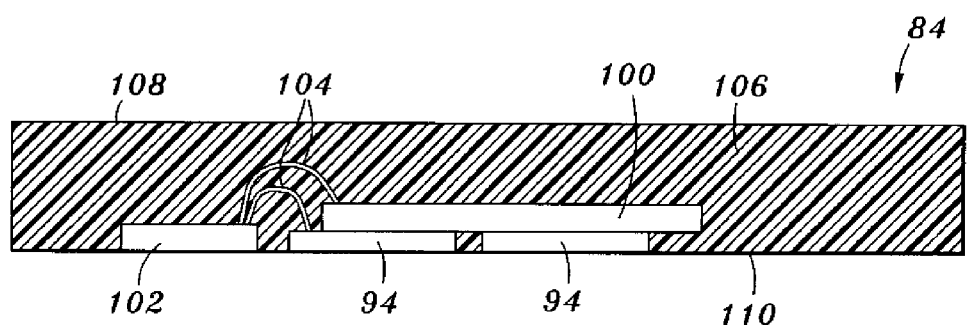
FIG. 19 is a cross-sectional view of the memory card shown in FIG. 18 subsequent to the removal of the tape from the ESC pads thereof.

Subsequent to the completion of the punching operation, electronic device 100 (e.g., a semiconductor die) is attached to the top surfaces of the contacts 94 in the manner shown in FIGS. 18 and 19. A second electronic device 102 (e.g., a semiconductor die or interposer) is attached to a portion of the top surface of the tape 98 adjacent the contacts 94 in the manner also shown in FIGS. 18 and 19. The electronic devices 100, 102 are electrically connected to each other and to the contacts 94 through the use of conductive wires 104.

After the electronic devices 102, 104 and/or other devices have been attached to the contacts 94 and tape 98 and electrically connected to the contacts 94 in the above-described manner, an encapsulant material is applied to the leadframe 86, the electronic devices 102, 104, and conductive wires 104. The encapsulant is further applied to the portion of the tape 98 remaining subsequent to the removal of the tie bars 96 by the punching operation. The encapsulant material, upon hardening, forms a body 106 of the memory card 84 (FIGS. 17C, 18 and 19). The body 106 defines a generally planar top surface 108, and an opposed, generally planar bottom surface 110. The body 106 is formed to provide a prescribed form factor for the memory card 84.

As best seen in FIG. 18, due to the application of the tape 98 to the bottom surface of the leadframe 86, in the fully formed memory card 84, the tape 98 is not embedded in the body 106, but rather simply extends over the entire bottom surface 110 of the body 106, including the bottom surfaces of the contacts 94 and the bottom surface of the electronic device 102. Thus, subsequent to the formation of the body 106, the tape 98 is peeled or otherwise completely removed from the fully formed memory card 84 in the manner shown in FIG. 19, thus exposing the bottom surface 110 of the body 106, as well as the bottom surfaces of the contacts 94 and electronic device 102. As further seen in FIG. 19, the bottom surfaces of the contacts 94 preferably extend in substantially flush relation to the bottom surface 110 of the body 106, as does the generally planar bottom surface of the electronic device 102. As will be recognized, the removal of the tie bars 96 by the completion of the above-described punching operation allows for the complete removal of the dambar 88 from the remainder of the leadframe 86, and results in the completed memory card 84 having no exposed metal features in the side surfaces of the body 106 which extend generally perpendicularly between the opposed top and bottom surfaces 108, 110 thereof.

Figure 20:
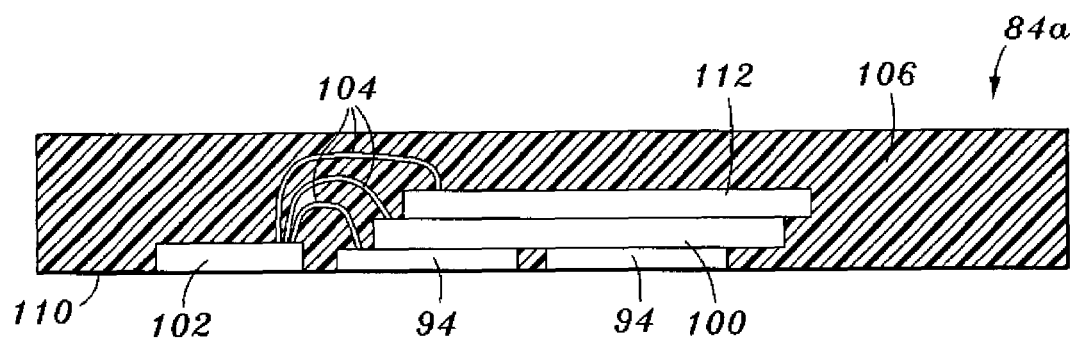
FIG. 20 is a cross-sectional view of a memory card formed in accordance with a ninth embodiment of the present invention.

Referring now to FIG. 20, there is shown a memory card 84a constructed in accordance with a ninth embodiment of the present invention. The memory card 84a is substantially similar to the above-described memory card 84, with the sole distinction lying in the inclusion of a third electronic device 112 (e.g., a semiconductor die) in the memory card 84a, such third electronic device 112 being stacked upon the top surface of the underlying electronic device 100. The electronic device 112 may be attached to the electronic device 100 through the use of, for example, a layer of suitable adhesive. In the memory card 84a, the conductive wires 104 are used to facilitate the electrical connection of the electronic devices 100, 102, 112 to each other and to the contacts 94 in the exemplary manner shown in FIG. 20.

Figure 21:
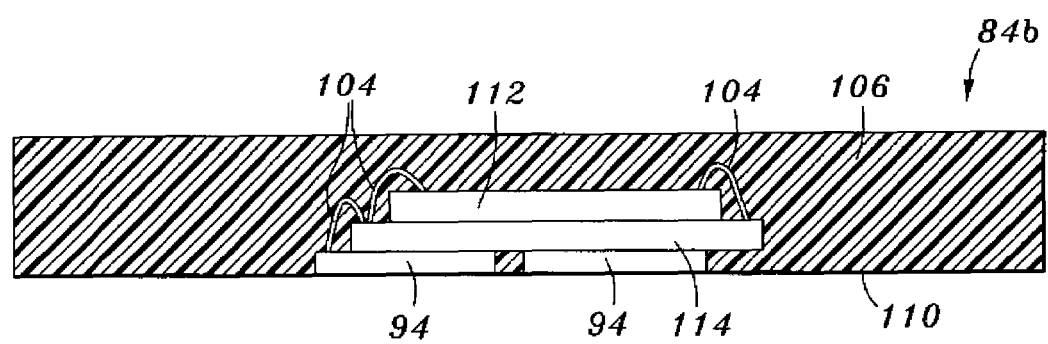
FIG. 21 is a cross-sectional view of a memory card formed in accordance with a tenth embodiment of the present invention.

Referring now to FIG. 21, there is shown a memory card 84b constructed in accordance with a tenth embodiment of the present invention. The memory card 84b bears substantial similarity to the memory card 84a, with one distinction lying in the substitution of the electronic device 100 of the memory card 84a with an interposer 114 in the memory card 84b. In this regard, in the memory card 84b, the electronic device 112 is stacked upon and attached to the top surface of the interposer 114, the bottom surface of which is positioned upon and attached to at least portions of the top surfaces of the contacts 94. The electronic device 112 is electrically connected to the interposer 114 through the use of the conductive wires 104 in the exemplary manner shown in FIG. 21, such conductive wire(s) 104 also being used to facilitate the electrical connection of the interposer 114 to the contacts 94. Further, in the memory card 84b, the electronic device 102 described above in relation to the memory card 84a is omitted, only the bottom surfaces of the contacts 94 thus being exposed in the bottom surface 110 of the body 106 in the memory card 84b.

Figure 22:
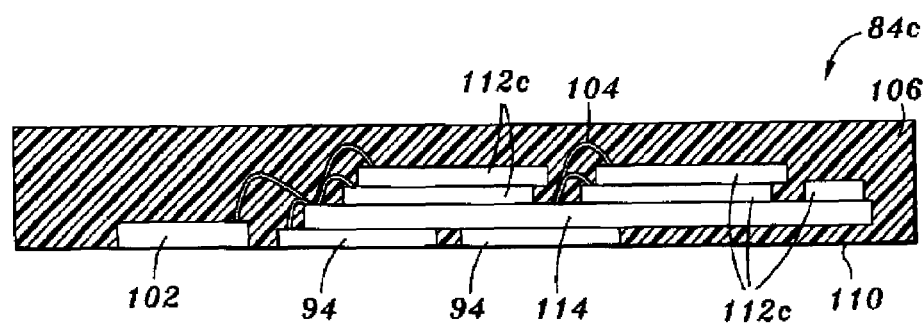
FIG. 22 is a cross-sectional view of a memory card formed in accordance with an eleventh embodiment of the present invention.

Referring now to FIG. 22, there is shown a memory card 84c constructed in accordance with an eleventh embodiment of the present invention. The memory card 84c is essentially a hybrid of the above-described memory cards 84a, 84b, and includes the electronic device 102 described above in relation to the memory card 84a, the generally planar bottom surface of such electronic device 102 being exposed in the bottom surface 110 of the body 106 in the memory card 84c. Additionally, in the memory card 84c, the electronic device 112 of the memory card 84b is substituted with a plurality of electronic devices 112c which, as shown in FIG. 22, may be arranged as two (2) stacked pairs, each such stacked pair being disposed upon and attached to the top surface of the interposer 114. Though not shown, it is contemplated that that the electronic devices 112c of each stacked pair may optionally be separated from each other by an intervening spacer. The bottom surface of the interposer 114 is positioned upon and attached to at least portions of the top surfaces of the contacts 94. The electronic devices 102, 112c are each electrically connected to the interposer 114 through the use of the conductive wires 104 in the exemplary manner shown in FIG. 22, such conductive wire(s) 104 also being used to facilitate the electrical connection of the interposer 114 to the contacts 94. As further seen in FIG. 22, an electronic device 112c separate from those included in the stacked pairs may also be electrically connected to the interposer 114 through the use of, for example, a flip-chip connection. Those of ordinary skill in the art will recognize that the five (5) electronic devices 112c shown in FIG. 22 is exemplary only, and that the memory card 84c may be fabricated to include any number of electronic devices 112c exceeding one.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A method of fabricating a memory card, comprising the steps of:
   a) providing a leadframe having:
      a dambar having opposed top and bottom dambar surfaces; and
      a plurality of contacts defining opposed top and bottom contact surfaces, each of the contacts being attached to the dambar by at least one tie bar which defines opposed top and bottom tie bar surfaces;
   b) applying a layer of tape to the leadframe such that the tape covers the bottom contact surfaces of the contacts, and at least a portion of the bottom dambar surface of the dambar;
   c) removing the tie bars from the leadframe;
   d) electrically connecting at least two electronic components to the leadframe, at least one of the electronic components being mounted to the tape; and
   e) forming a body on the leadframe such that at least portions of the bottom contact surfaces of the contacts and at least a portion of one of the electronic components are exposed in a bottom body surface of the body.

2. The method of claim 1 further comprising the steps of:
   f) removing the tape from the bottom body surface of the body to expose the bottom contact surfaces of the contacts and a portion of one of the electronic components; and
   g) removing the dambar from the leadframe.

3. The method of claim 1 wherein step (c) comprises removing the tie bars from the leadframe through a punching operation which punches through at least a portion of the tape.

4. The method of claim 1 wherein:
   step (a) comprises providing a leadframe having a die pad which defines opposed top and bottom die pad surfaces and is attached to the dambar; and
   step (d) comprises attaching one of the electronic components to the top die pad surface of the die pad; and
   step (e) comprises forming the body to cover the die pad and the electronic component attached thereto.

5. The method of claim 4 wherein:
   step (a) comprises providing a leadframe having a plurality of conductive traces which each define opposed top and bottom trace surfaces and extend from respective ones of the contacts toward the die pad;
   step (d) comprises electrically connecting each of the electronic components to at least some of the conductive traces; and
   step (e) comprises forming the body such that the conductive traces are covered thereby.

6. The method of claim 5 wherein:
   step (a) comprises providing a leadframe wherein the die pad is attached to the dambar by at least one pad tie bar;
   step (c) further comprises severing the pad tie bars from the dambar; and
   step (e) comprises forming the body to cover a residual portion of the pad tie bar.

7. The method of claim 5 wherein step (a) comprises providing a leadframe wherein each of the conductive traces is formed to include a downset such that the contacts extend along a common first plane and the die pad extends along a second plane which is disposed in spaced, generally parallel relation to the first plane.

8. The method of claim 5 wherein step (a) comprises providing a leadframe wherein each of the conductive traces is half-etched such that the bottom trace surfaces are each recessed relative to the bottom contact surfaces.

9. The method of claim 1 wherein:
   step (a) comprises providing a leadframe wherein the bottom surfaces of contacts are each generally planar; and
   step (e) comprises forming the body such that the bottom body surface thereof is generally planar and the bottom contact surfaces of the contacts are exposed in and substantially flush with the bottom body surface.

10. The method of claim 1 wherein step (d) comprises electrically connecting the electronic components to the leadframe through the use of conductive wires.

11. The method of claim 1 wherein step (d) comprises mounting one of the electronic components to the top contact surface of at least one of the contacts.

12. The method of claim 11 wherein step (d) comprises mounting a stacked pair of semiconductor dies to the top contact surface of at least one of the contacts.

13. A method of fabricating a memory card, comprising the steps of:
   a) providing a leadframe having:
      a dambar having opposed top and bottom dambar surfaces; and
      a plurality of contacts defining opposed top and bottom contact surfaces, each of the contacts being attached to the dambar by at least one tie bar which defines opposed top and bottom tie bar surfaces;
   b) applying a layer of tape to the leadframe such that the tape covers the bottom contact surfaces of the contacts, and at least a portion of the bottom dambar surface of the dambar;
   c) removing the tie bars from the leadframe;
   d) electrically connecting at least one electronic component to the contacts of the leadframe; and
   e) forming a body on the leadframe such that at least portions of the bottom contact surfaces of the contacts are exposed in a bottom body surface of the body.

14. The method of claim 13 wherein step (d) comprises mounting the electronic component to the top contact surface of at least one of the contacts.

15. The method of claim 14 wherein step (d) comprises mounting an interposer to the top contact surface of at least one of the contacts and mounting a semiconductor die to the interposer.

16. The method of claim 13 further comprising the steps of:
f) removing the tape from the bottom body surface of the body to expose the bottom contact surfaces of the contacts; and
g) removing the dambar from the leadframe.

17. The method of claim 13 wherein step (c) comprises removing the tie bars from the leadframe through a punching operation which punches through at least a portion of the tape.

18. The method of claim 13 wherein:
step (a) comprises providing a leadframe wherein the bottom surfaces of contacts are each generally planar; and
step (e) comprises forming the body such that the bottom body surface thereof is generally planar and the bottom contact surfaces of the contacts are exposed in and substantially flush with the bottom body surface.

19. The method of claim 13 wherein step (d) comprises electrically connecting the electronic component to the contacts of the leadframe through the use of conductive wires.

20. A method of fabricating a memory card, comprising the steps of:
a) providing a leadframe having a plurality of contacts defining opposed top and bottom contact surfaces, and a plurality of tie bars protruding from respective ones of the contacts;
b) applying a layer of tape to the leadframe such that the tape covers the bottom contact surfaces of the contacts;
c) removing the tie bars from the leadframe;
d) electrically connecting at least one electronic component to the leadframe, the electronic component being mounted to the tape; and
e) forming a body on the leadframe such that at least portions of the bottom contact surfaces of the contacts and at least a portion of the electronic component are exposed in a bottom body surface of the body.

\* \* \* \* \*